US007003749B2

(12) United States Patent
Subasic et al.

(10) Patent No.: US 7,003,749 B2
(45) Date of Patent: Feb. 21, 2006

(54) CONSTRAINT DATA MANAGEMENT FOR ELECTRONIC DESIGN AUTOMATION

(75) Inventors: Pero Subasic, Pittsburgh, PA (US); George Bogdan Arsintescu, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 185 days.

(21) Appl. No.: 10/755,557

(22) Filed: Jan. 12, 2004

(65) Prior Publication Data

US 2005/0155006 A1 Jul. 14, 2005

(51) Int. Cl.
*G06F 17/50* (2006.01)

(52) U.S. Cl. ............................... 716/10; 716/9; 716/11

(58) Field of Classification Search .................... 716/1, 716/8–14

See application file for complete search history.

(56) References Cited

U.S. PATENT DOCUMENTS

| | | | | |
|---|---|---|---|---|
| 5,050,091 | A * | 9/1991 | Rubin | 716/10 |
| 6,058,252 | A * | 5/2000 | Noll et al. | 716/10 |
| 6,701,504 | B1 * | 3/2004 | Chang et al. | 716/10 |
| 6,789,244 | B1 * | 9/2004 | Dasasathyan et al. | 716/10 |
| 2005/0044512 | A1 * | 2/2005 | Lockyear et al. | 716/1 |

OTHER PUBLICATIONS

CLIPS (Jun. 15, 2003). "CLIPS Basic Programming Guide Version 6.21," *CLIPS Reference Manual* pp. i-xiv (Table of Contents Only).

CLIPS (Jun. 15, 2003). "CLIPS Advanced Programming Guide Version 6.21," *CLIPS Reference Manual* pp. i-x. (Table of Contents Only).

Malavasi, E. et al. (Aug. 1996). "Automation of IC Layout with Analog Constraints," *IEEE Transactions on Computer-Aided Design of Integrated Circuits and Systems* 15(8):923-942.

* cited by examiner

*Primary Examiner*—Thuan Do
*Assistant Examiner*—Binh Tat
(74) *Attorney, Agent, or Firm*—Morrison & Foerster LLP

(57) ABSTRACT

In a method of determining the existence of one or more conflicts in the placement or configuration of circuit objects defining a circuit, a number of constraints is defined, each of which imposes at least one limitation on at least one circuit object. A number of constraint families is then defined, each of which includes a subset of interrelated constraints. For each of a subset of the constraint families, a determination is made if a conflict exists between the constraints thereof. If not, pairs of constraint families are defined from the plurality constraint families. For each of a subset of the pairs of constraint families, a determination is made if a conflict exists between the constraints thereof. If not, the circuit objects defining the circuit are laid out subject to the constraints.

24 Claims, 9 Drawing Sheets

124

122

| CONSTRAINT TYPE | OBJECT<br>DEVICE | PIN | RAIL | CONDUCTOR NETWORK |
|---|---|---|---|---|
| LOCATION | ● | ● | ● | |
| PROXIMITY | ● | ● | ● | |
| PROXIMITY MATCHING | ● | ● | ● | |
| SYMMETRY | ● | ● | | ● |
| GEOMETRY SHARING | ● | | | |
| CONDUCTOR NETWORK CROSSING | | | | ● |
| LAYER ASSOCIATION | | ● | ● | ● |
| ORIENTATION | ● | | | |
| ORIENTATION MATCHING | ● | | | |
| VARIANT | ● | | | |
| VARIANT MATCHING | ● | | | |
| GEOMETRY | | ● | ● | ● |
| WIRE SPACING | ● | ● | ● | |
| VARIANT GENERATOR | ● | ● | | |
| CONDUCTOR NETWORK ASSOCIATION | ● | ● | ● | |
| CONDUCTOR NETWORK USE POLICY | | | | ● |
| DIRECTION POLICY | | | | ● |
| VIA STYLE | | | | ● |
| CONDUCTOR NETWORK PRIORITY | | | | ● |
| CROSSTALK | | | | ● |
| PARASITIC | ● | ● | | |
| GROUP ASSOCIATION | ● | | | |
| MATCHED PARAMETER | ● | | | |

CONSTRAINT TYPE

| CONSTRAINT TYPE | LOCATION | PROXIMITY | PROXIMITY MATCHING | SYMMETRY | GEOMETRY SHARING | CONDUCTOR NETWORK CROSSING | LAYER ASSOCIATION | ORIENTATION | ORIENTATION MATCHING |
|---|---|---|---|---|---|---|---|---|---|
| LOCATION | X | ● | ● | | | | | ● | ● |
| PROXIMITY | ● | X | ● | | | | | | |
| PROXIMITY MATCHING | ● | ● | X | | | | | | |
| SYMMETRY | | | | X | | | | | |
| GEOMETRY SHARING | | | | | X | | | | |
| CONDUCTOR NETWORK CROSSING | | | | | | X | ● | | |
| LAYER ASSOCIATION | | | | | | ● | X | | |
| ORIENTATION | ● | | | | | | | X | |

MATCH TO B-B IN FIG. 5c

MATCH TO A-A IN FIG. 5b

FIG. 5a

CONSTRAINT DATA MANAGEMENT FOR ELECTRONIC DESIGN AUTOMATION

BACKGROUND OF THE INVENTION

1. Field of the Invention

The present invention relates to electronic design automation for an integrated circuit and, more particularly, to avoiding conflicts between constraints associated with objects that define the circuit.

2. Description of Related Art

Integrated circuit (IC) designers often use electronic design automation (EDA) software to assist in the design process. IC design using EDA software generally involves an iterative process whereby a circuit layout of the IC is usually perfected. State-of-the-art EDA software utilizes one or more optimization algorithms and design intent data to transform circuit schematic into a circuit layout that will perform a desired operation. Each such algorithm is a constraint-driven optimization algorithm and the design intent data is captured in constraints associated with objects that define the circuit, i.e., circuit objects, that the algorithm utilizes for placement of the circuit objects.

Throughout the design process, the designer may use one or more optimization algorithms, each possibly having a different set of constraints. When design iterations are performed, constraints from later stages of the design process are often used as input data for a new optimization algorithm. With ever-increasing design complexity, the number and diversity of constraints and the management operations needed to prepare the constraints for use with optimization algorithm(s) increases.

A top-down design methodology is commonly employed with EDA software to manage the complexity of the design. In this methodology, the designer designs an IC by hierarchically defining high level circuit structures of the circuit together with associated design goals and constraints, and then decomposes each circuit structure into smaller and smaller components. At higher levels in the IC design, the designer specifies constraints on the behavior of each circuit structure that needs to be transformed into circuit object constraints and electrical parameter constraints using simulation algorithms, circuit sizing algorithms and other such algorithms. Also, at higher levels in the IC design, organizational constraints on the generic placement of the circuit objects may be created which will be used by a placement algorithm to determine the possible location of a given circuit object in the circuit layout. At lower levels in the IC design, the size of each circuit object and the electrical constraints of the circuit are used to derive geometrical constraints that will be used by one or more placement algorithms to derive the precise position of the circuit objects in the circuit layout. Circuit objects can include devices, pins, rails and conductor networks that define the wiring that connects the devices, the pins and the rails.

After top-down realization of the IC design, the result is used to verify whether the higher-lever constraints have been met in a bottom-up fashion. Design iterations are often needed to perfect the IC design wherefrom constraints can be extracted to be used by higher level operations. Throughout the entire design process, designers provide each algorithm with a valid constraint set while also transforming constraint sets between the output of a given algorithm and the input of the next algorithm(s).

Two aspects of managing constraints in a top-down design methodology include: (1) maintaining a viable set of constraints for each algorithm that exists in the design flow utilized by the methodology; and (2) providing a work-flow mechanism to organize and transform constraints between the algorithms used such that the design process can be easily controlled and tuned by the designer.

While several automated solutions have been proposed to manage constraints, these solutions have limitations that restrict their utility. Specifically, prior solutions are limited by the lack of generality and completeness. Various solutions for verification of a constraint set for a given optimization algorithm have been proposed, but they lack the extensibility needed to allow for new algorithms or new constraints to be added, or lack the ability to perform cross-checking between different sets of constraints. Prior solutions for managing constraints through a work-flow are targeted to specific applications and cannot be extended to manage generic work-flow requirements. Also, none of the previous solutions allows user customization and intervention in the constraint management process.

It would therefore be advantageous to provide an improved constraint management method that avoids the above limitations and others by providing a scalable solution for forming viable constraint sets for the algorithms employed in a given design flow and that allows users to manage and transform constraints throughout the workflow. It would also be advantageous to provide a method for avoiding conflicts between constraints associated with objects that define a circuit. Still other advantages will become apparent to those of ordinary skill in the art upon reading and understanding the following detailed description.

SUMMARY OF THE INVENTION

The present invention is a computer aided method for determining the existence of one or more conflicts in a placement or configuration of objects defining a circuit in the design of an integrated circuit. The method includes defining a plurality of constraints, each of which imposes at least one limitation on the placement or configuration of at least one object that defines a circuit. A plurality of constraint families is defined with each constraint family comprised of a subset of the defined constraints of the same type. For each constraint family of a subset of the plurality of constraint families, a determination is made if a conflict exists between the constraints of the constraint family. Pairs of constraint families are then defined from the plurality of constraint families. For each pair of constraint families of a subset thereof, a determination is made if a conflict exists between at least one constraint of one constraint family of said pair and at least one constraint of the other constraint family of said pair. If a conflict is determined to exist between constraints of a pair of constraint families, at least one of the constraints is amended and the steps of determining if a conflict exists between the constraints of each constraint family and determining if a conflict exists between constraints of each pair of constraint families and, if so, amending at least one of the constraints is repeated until no conflict exists. The objects defining the circuit can then be laid out subject to the constraints.

If a conflict is determined to exist between the constraints of a constraint family, at least one of the constraints can be amended and the steps of determining if a conflict exists between the constraints of the constraint family and, if so, amending at least one of the constraints can be repeated until no conflict is determined to exist. Desirably, at least one of the constraints that contributes to the existence of the conflict is amended.

Each constraint family can include at least one constraint associated with at least one object defining the circuit. Each object can be one of a device, a pin, a rail, a conductor network or any other desirable element in the circuit.

Each constraint can be one of the following constraint types: location constraint, proximity constraint, proximity matching constraint, symmetry constraint, geometry sharing constraint, conductor network crossing constraint, layer association constraint, orientation constraint, orientation matching constraint, variant constraint, variant matching constraint, geometry constraint, conductor spacing constraint, variant generator constraint, conductor network association constraint, conductor network use policy constraint, direction policy constraint, via style constraint, conductor network priority constraint, crosstalk constraint, parasitic constraint, group association constraint, parameter matching constraint or any other desirable constraint.

Each constraint family can have associated therewith at least one criterion for determining the existence of a conflict between the constraints of the constraint family. Similarly, each pair of constraint families can have associated therewith at least one criterion for determining the existence of a conflict between the constraints of said pair of constraint families.

The step of defining a plurality of constraints can include inputting at least one object defining the circuit, or a symbol representing the object, into a template that includes at least one constraint for placement or configuration of the object in the circuit and determining if the object can be implemented in accordance with the constraint. The step of defining a plurality of constraint families can include associating the constraint with one of the constraint families if the object can be implemented in accordance with the constraint.

Alternatively, the step of defining the plurality of constraints can include inputting into the template a number of objects defining the circuit, or a symbol representing each object, with the number of objects either being the same as or different from the number of constraints of the template, and determining if the objects can be implemented in accordance with the constraints. The step of defining a plurality of constraint families can include associating the constraints with at least one of the constraint families if the objects can be implemented in accordance with the constraints.

One subset of the constraints of the template can be associated with one constraint family while another subset of the constraints of the template can be associated with another constraint family. Each template can be associated with either placement, routing and/or configuration of an object in the circuit layout.

Lastly, the invention is a computer-aided method for determining the existence of one or more conflicts in the placement or configuration of objects defining a circuit in the design thereof. The method includes selecting objects that define a circuit and associating constraints with a subset of the selected objects, with each constraint imposing at least one restriction on the placement, routing and/or configuration of at least one of the selected objects. A first matrix of objects vs. constraint types is defined, with each cell of the first matrix being related to a unique object—constraint type pair. Each constraint type of the first matrix corresponds to one of the constraints associated with the subset of the selected objects. Each constraint associated with at least one of the selected objects is associated with one of the cells of the first matrix that has said constraint as the constraint type of its related object—constraint type pair. The constraint(s) associated with each cell define an associated constraint family. For each constraint family that includes a plurality of constraints, a determination is made if at least one conflict exists between the constraints of said constraint family. A second matrix of constraint type vs. constraint type is defined, wherein the constraint types of the second matrix are the same as constraint types of the first matrix and each cell of the second matrix is related to a unique constraint—constraint pair. Each cell of a subset of the cells of the second matrix has associated therewith the constraint families associated with the cells of the first matrix that have as the constraint types of their related object—constraint type pair one of the constraint types of the constraint—constraint pair associated with the cell of the second matrix. For each pair of constraint families associated with a cell of the second matrix, a determination is made if at least one conflict exists between at least one constraint of one of said pair of constraint families and at least one constraint of the other of said pair of constraint families. If a conflict is determined to exist, at least one constraint is amended and the steps of determining if at least one conflict exists between the constraints of a pair of constraint families and the amending of at least one constraint if a conflict is determined to exist is repeated until no conflicts exist. Thereafter, the objects defining the circuit are laid out subject to the constraints.

BRIEF DESCRIPTION OF THE DRAWINGS

FIG. 4*a* is a table of Objects vs. Constraint Types having cells for storing constraints associated with the various circuit objects;

DETAILED DESCRIPTION OF THE INVENTION

The present invention will be described with reference to the accompanying figures where like reference numbers correspond to like elements.

The present invention is a method which is desirably embodied in computer readable program code or a software program which executes on a processor of a computer system, e.g., a standalone or networked computer or workstation, that includes a computer storage, an input/output system, such as a display, a mouse and a keyboard, a media drive, such as a disk drive, CD ROM drive, etc., and a computer—usable storage medium capable of storing the computer readable program code that embodies the present invention. Under control of the software program, the processor is capable of configuring and operating the computer system in a manner to implement the present invention.

Computer systems of the type described above are well known in the art and will not be described herein in detail for purpose of simplicity.

Figure 1:
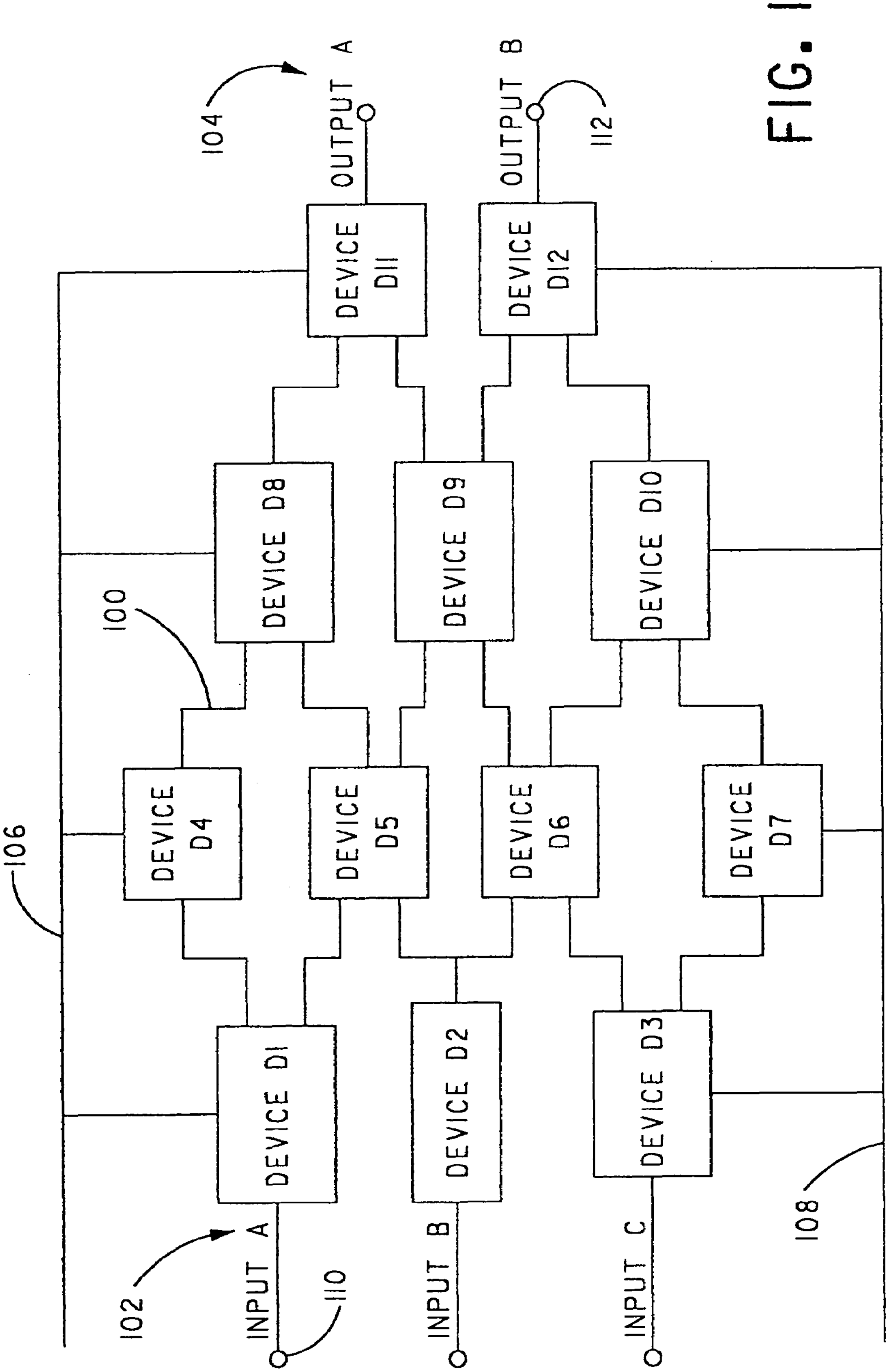
FIG. 1 is a schematic of an exemplary circuit formed from a number of circuit objects that define the circuit.

With reference to FIG. 1, a circuit input to the computer system under the control of the software program includes a collection of active and/or passive circuit devices, e.g., devices D1–D12, interconnected by conductors or a conductor network 100 to desirably form a predetermined function. The circuit also includes a power rail 106 for selectively providing power to one or more of the active and/or passive circuit devices and a ground rail 108 for supplying a ground reference to one or more of the active and/or passive circuit devices. Lastly, the circuit includes one or more input pins 110 for receiving one or more input signals from one or more external devices (not shown) and one or more output pins 112 for providing one or more output signals to the same or different external devices (not shown). If desired, the circuit can also include other elements (not shown) known in the art. The circuit shown in FIG. 1 is for purpose of illustration and is not to be construed in any manner as limiting the present invention.

In FIG. 1, each device D1–D12; each pin 110, 112; each rail 106, 108; and the conductor network 100 each represent a circuit object that defines the circuit. Each circuit object can have associated therewith one or more constraints on its placement in a layout of the circuit or its configuration in the circuit layout. As used herein, "configuration" means how a circuit object is physically instantiated, e.g., a circuit object having a length x and a width y. Examples of placement constraints include device D1 is above D2; device D3 is below device D2; device D4 is to the right of device D1; device D4 is above device D5; and so forth.

Figure 2:
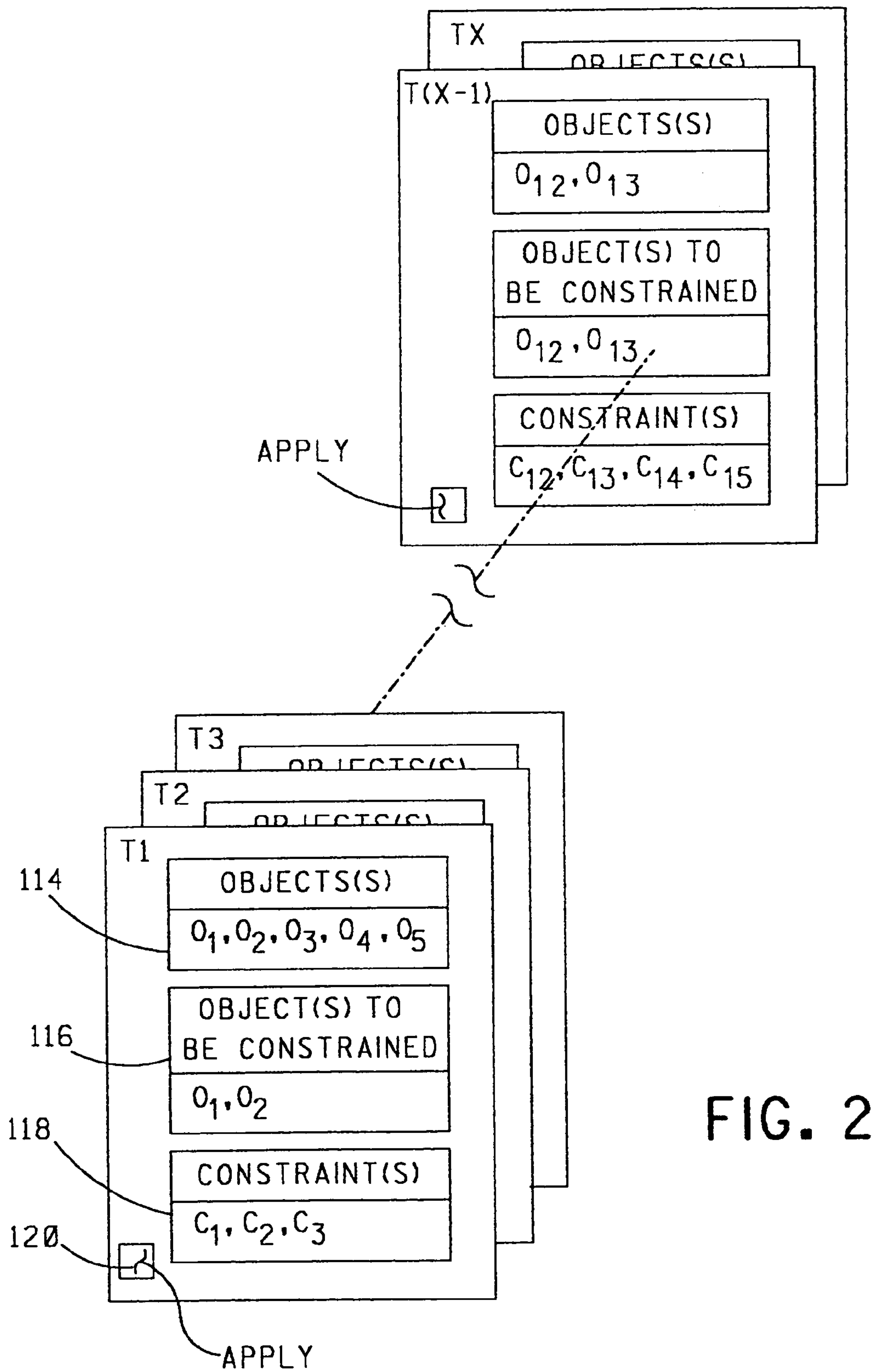
FIG. 2 is a block diagram of a plurality of templates T1–Tx, with each template T including predetermined constraints to be applied to one or more of the circuit objects that are to be input into fields of the template T for the purpose of matching one or more of the constraints to one or more of the circuit objects.

With reference to FIG. 2 and with continuing reference to FIG. 1, to facilitate the matching of constraints with corresponding circuit objects, the software program can cause one or more templates T1–Tx to be displayed on the computer's display, with each template T1–Tx including one or more predefined constraints that can be applied to a structure of the circuit that includes a subset of the circuit objects. Non-limiting examples of templates can include an input stage template for circuit objects comprising an input stage structure of the circuit, e.g., pins 110 and devices D1–D3; a current source template for circuit objects comprising a current source structure (not shown) of the circuit; a symmetrical wiring template for circuit objects comprising a symmetrical conductor network structure of the circuit, e.g., conductor network 100, and so forth.

Figure 3:
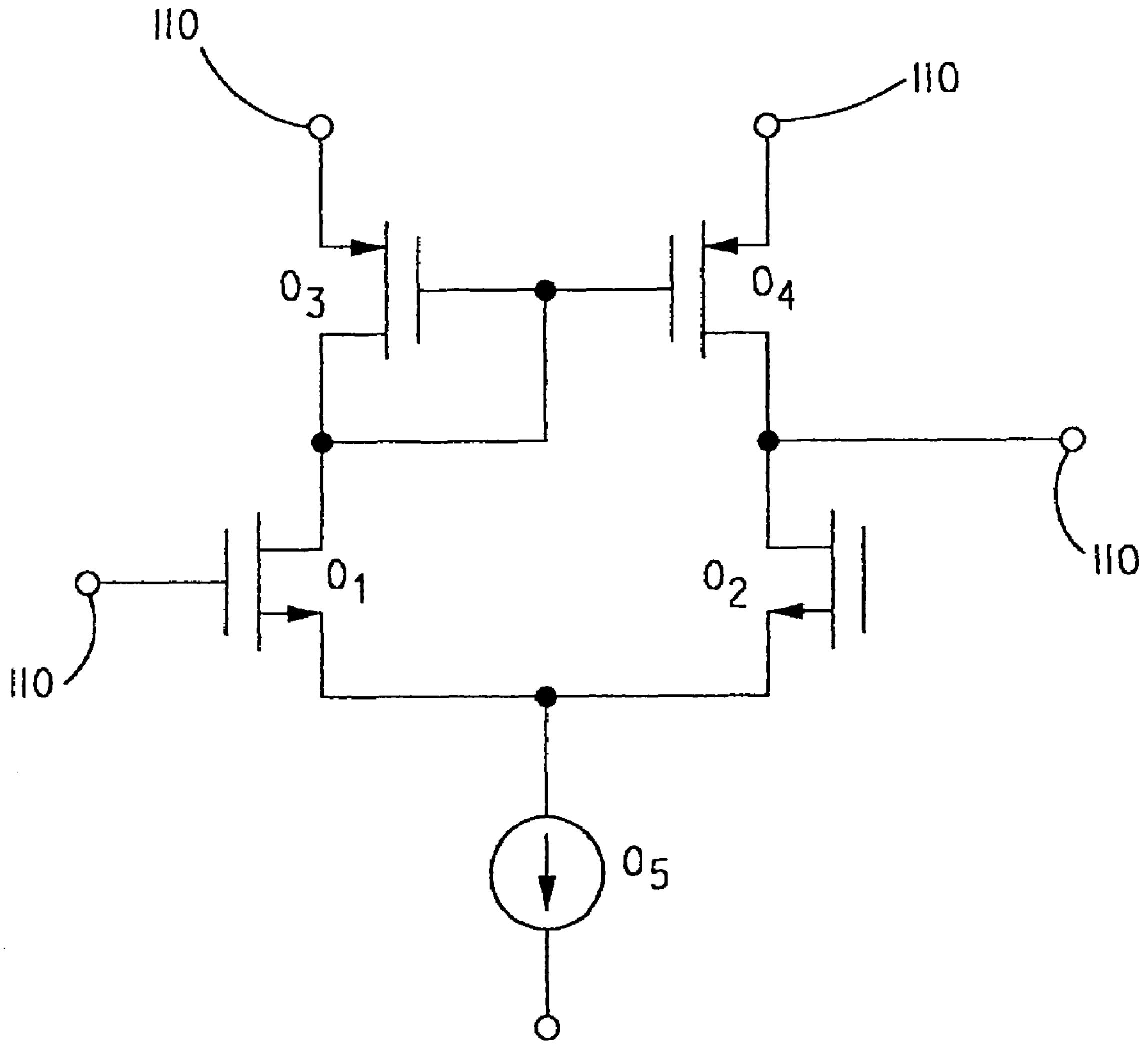
FIG. 3 is a schematic diagram of an exemplary input stage operational amplifier.

Each template T1–Tx can be utilized for matching one or more constraints thereof with one or more circuit objects. For example, an input stage template can be utilized for associating one or more circuit objects, e.g., devices, conductors and pins, of an input stage operational amplifier, shown in FIG. 3, with one or more constraints applicable thereto. The input stage operational amplifier shown in FIG. 3 includes two differential devices in the form of circuit objects $O_1$ and $O_2$, one current driver device in the form of circuit object $O_5$ and two load devices in the form of circuit objects $O_3$ and $O_4$. Suppose now that template T1 in FIG. 2 corresponds to an input stage operational amplifier template that can be displayed on the display of the computer system operating under the control of the software program for receiving appropriate data entry, with field 118 of template T1 displaying the predefined constraints of template T1 that can be matched with corresponding circuit objects of the input stage operational amplifier shown in FIG. 3. A designer of the input stage operational amplifier shown in FIG. 3 initially causes template T1 to be displayed on the display of the computer system with the predetermined constraints, e.g., $C_1$, $C_2$ and $C_3$, applicable to template T1 displayed in a constraint field 118 thereof. Thereafter, the designer causes various circuit objects, e.g., circuit objects $O_1$–$O_5$, associated with the input stage operational amplifier to be input into an object(s) field 114 and causes one or more of the circuit objects input into field 114 and which are to be constrained to be input into a constrained object(s) field 116 of template T1. If necessary, the designer can cause appropriate numerical values to be associated with each constraint. For example, if constraint $C_1$ in field 118 is related to the ratio of widths of circuit objects $O_1$ and $O_2$ input into field 116, the value that the designer can enter into field 118 in connection with constraint $C_1$ represents this width ratio. For example, if the value of constraint C, is set to "2", then the width of circuit object $O_1$ will be twice that of circuit object $O_2$, or vice versa.

Once all the circuit objects of the input stage operational amplifier template T1 have been entered into field 114 and all the circuit objects to be constrained have been entered into field 116, the designer causes one or more of the predefined constraints of template T1 to be matched with one or more corresponding circuit objects input into field 116 of template T1. Since the particular manner in which one or more constraints in field 118 are matched to one or more circuit objects in field 116 can occur in any desirable and suitable manner, a specific manner of matching constraints to circuit objects will not be described herein for purpose of simplicity.

Desirably, the software program includes a plurality of templates T, with each template T configured for matching one or more predefined constraints associated with said template T with one or more circuit objects of a particular circuit structure associated with said template T, e.g., input stage, current source, symmetrical wiring template, and so forth. The software program is desirably configured to be utilized with a plurality of different circuits, each of which may not require the use of all of the available templates T. Accordingly, it is envisioned that a majority of the circuits will require the use of less than all of the available templates for matching circuit objects with corresponding constraints.

Alternatively, each constraint $C_1$–$C_3$ displayed in field 118 of template T1 can include predefined values and one or more of these constraints can be automatically matched to one or more circuit objects entered into field 116. Lastly, at even a higher level, a pattern matching routine can be utilized to identify circuit objects $O_1$–$O_5$ as comprising an input stage operational amplifier, to automatically select template T1, to automatically input circuit objects $O_1$–$O_5$ into fields 114 and 116 of template T1, as required, and to automatically match one or more of constraints $C_1$–$C_3$ with the one or more circuit objects input into field 116 of template T1 thereby further simplifying the matching of one or more constraints of field 118 of template T1 to one or more circuit objects input into field 116 of template T1.

The use of templates T for matching one or more constraints of each template T with one or more circuit objects input into the template T can continue until all of the desired matching of constraints with corresponding circuit objects is complete. While described in connection with use of templates T, the matching of constraints with corresponding circuit objects can occur in any suitable and desirable manner. Accordingly, the description herein of using templates T for such matching is not to be construed as limiting the invention. However, the use of templates T provides a structured means, not available heretofore, for matching constraints with circuit objects.

Non-limiting examples of constraints of an input stage template can include: a device—group association constraint for all of circuit objects $O_1$–$O_5$; a device—symmetry constraint for circuit objects $O_1$ and $O_2$; a device—self—symmetry constraint for circuit object $O_5$; a device—symmetry constraint for circuit objects $O_3$ and $O_4$; a conductor network—symmetry constraint for each conductor connecting circuit objects $O_1$–$O_4$; a pin—symmetry constraint for each circuit object in the form of an input pin; device—variant generator constraint for selecting an appropriate one of a plurality of available software routines for generating a desired variant of the configuration of each circuit object of each pair of circuit objects ($O_1$, $O_2$) and ($O_3$ , $O_4$); a device—variant matching constraint for circuit objects $O_3$ and $O_4$; and a device—orientation matching constraint for circuit objects $O_3$ and $O_4$.

Non-limiting examples of constraints for a current source template can include: a device—parameter matching constraint for matching one or more parameters, such as gain, length, width, etc., of two or more circuit objects; a device—variant generator constraint for selecting an appropriate software routine for generating a desired variant of the configuration of a circuit object; a device—orientation constraint for determining an orientation of a circuit object; and, optionally, a device—variant matching constraint, if and only if a perfect match is required between a pair of circuit objects.

Non-limiting examples of constraints associated with a symmetrical wiring template can include: a conductor network—priority constraint for establishing which one of a plurality of circuit objects in the form of conductor networks are to be routed first; a conductor network—symmetry constraint for establishing symmetry between pairs of circuit objects in the form of conductor networks; a conductor network—conductor network crossing constraint for establishing how circuit objects in the form of conductors of two or more conductor networks cross; an optional conductor network—crosstalk constraint for establishing the level of crosstalk between circuit objects in the form of conductors of one or more conductor networks; and, optionally, a pin—symmetry constraint for establishing symmetry between pairs of circuit objects in the form of pins.

The foregoing non-limiting examples of constraints for an input stage template, a current source template and a symmetrical wiring template are not to be construed as limiting the invention since the number and types of templates utilized with each circuit will be determined by the circuit structures of the circuit.

Figure 4B:
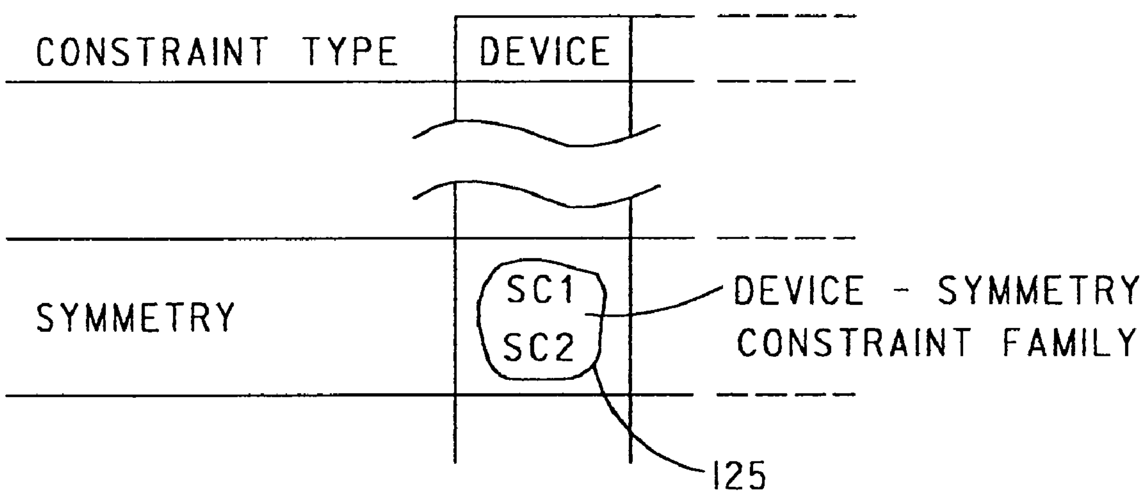
FIG. 4*b* is an isolated view of the Device—Symmetry cell of FIG. 4*a*.

With reference to FIGS. 4*a* and 4*b*, and with continuing reference to all previous figures, the matching of constraints with corresponding circuit objects continues until all of the desired constraints have been matched to circuit objects. To complete this matching within each template, the designer can select an "Apply" button 120 on the template. Prior to completing this matching, however, a software routine associated with each template determines if each circuit object having one or more constraints associated therewith can be implemented in accordance with said constraint(s). If not, a suitable error message can be output to the computer's display. In response to selecting the "Apply" button 120, the software program completes the association between circuit objects and constraints and inputs each constraint associated with a circuit object into an appropriate one of the cells 122 of an Object vs. Constraint Type table 124 shown in FIG. 4*a*. One example of a circuit object that cannot be implemented in accordance with a constraint may include a single circuit object having associated therewith a proximity matching constraint for matching the proximity of two circuit objects.

The constraint types associated with the rows of the table 124 are the predetermined constraints associated with the various templates T available to the designer. However, the circuit object associated with each column of table 124 is broken down by circuit object type, namely, device, pin, rail and conductor network. When determining which cell 122 of table 124 where a constraint associated with a circuit object is to be input, an evaluation of the circuit object type to which each constraint is associated is undertaken. For example, if a symmetry constraint is associated with a circuit object in the form of a device, the symmetry constraint is input into the cell 122 of table 124 that exists at the intersection of the Device column and the Symmetry row. Each symmetry constraint associated with a circuit object in the form of a device is input into this same cell 122 of table 124. Thus, cell 122 of table 124 that exists at the intersection of the Device column and the Symmetry row includes all of the symmetry constraints, generated by any template T, associated with any circuit object in the form of a device. For example, as shown in FIG. 4*b*, if template T1 generates a first of symmetry constraint (SC1) for circuit objects $O_1$ and $O_2$ and a template T2 generates a second symmetry constraint (SC2) for circuit objects $O_3$ and $O_4$, both first and second symmetry constraints SC1 and SC2 will be input into the cell 122 of table 124 at the intersection of the Device column and the Symmetry row.

In a similar manner, each symmetry constraint applicable to a circuit object in the form of a pin is input into the cell 122 of table 124 that exists at the intersection of the Pin column and the Symmetry row. Moreover, each Group Association constraint applicable to an object in the form of a device is input into the cell 122 of table 124 at the intersection of the Device column and the Group Association row. Following this pattern, constraints applicable to like circuit objects are input into the same cell 122 of table 124, regardless of which template T is utilized to associate each constraint with each circuit object.

The cells 122 of table 124 that include dots (".") therein are cells where constraints associated with circuit objects are typically input. The empty cells 122 of table 124 represent cells where constraints are typically not input. However, this is not to be construed as limiting the invention.

The constraints input into each cell 122 of table 124 define for the cell a corresponding constraint family. For example, constraints SC1 and SC2 input into the cell 122 of table 124 at the intersection of the Device column and the Symmetry row, shown in FIG. 4*b*, comprise a Device—Symmetry constraint family 125 for this cell 122. The constraint family of each cell 122 of table 124 can include any number of constraints. For example, a constraint family can include only one constraint or can include a plurality of constraints.

Once all of the constraints associated with circuit objects for a circuit have been input into the various cells 122 of table 124, whereupon the various constraint families are defined, each constraint family having two or more constraints associated therewith is evaluated to determine if one or more conflicts exist between the constraints of the constraint family. For example, if the constraint family associated with the cell 122 of table 124 at the intersection of the Device column and the Location row, i.e., the Device—Location cell, includes constraints requiring placement of one instantiation of a circuit object in two or more different locations of a circuit layout, a conflict exists between these constraints since the same instantiation of the circuit object cannot exist at two different locations of the circuit layout at the same time. Therefore, this conflict must be corrected before the circuit layout can be implemented. The foregoing example of the placement of the same instantiation of a circuit object at two different locations in the circuit layout represents a conflict in the placement of the circuit object. However, this is not to be construed as limiting the invention since conflicts can be of any type or form, such as conflict in the permissible amount of unwanted electrical interaction between a pair of circuit objects.

To facilitate evaluation if one or more conflicts exist between the constraints of each constraint family, each cell 122 of table 124 which is to receive a constraint as input has associated therewith a software routine that includes one or more predefined criterion for determining if one or more conflicts exist between the constraints of the constraint family associated with the cell.

If a conflict is determined to exist between constraints of a constraint family, one or more of the constraints of the constraint family, desirably one or more of the constraints contributing to the existence of the conflict, must be amended in a manner that avoids the conflict while, desirably, not creating additional conflicts. To this end, any suitable method can be utilized for amending one or more constraints to avoid a conflict therebetween. For example, if a conflict is determined to exist between two constraints that were created in two different templates T, the designer can reopen one or both of the templates T for editing one or both of the constraints. Once a designer has edited one or both of the constraints, the designer can select the appropriate "Apply" button(s) 120 whereupon, if each circuit object can be implemented in accordance with its edited constraint, each edited constraint replaces each instance of its original constraint in table 124. Thereafter, the process of determining if a conflict exists between the constraints of each constraint family that includes two or more constraints and if necessary, the editing and the replacement of constraints can continue until no conflict exists between the constraints of each constraint family having two or more constraints associated therewith.

Figure 5B:
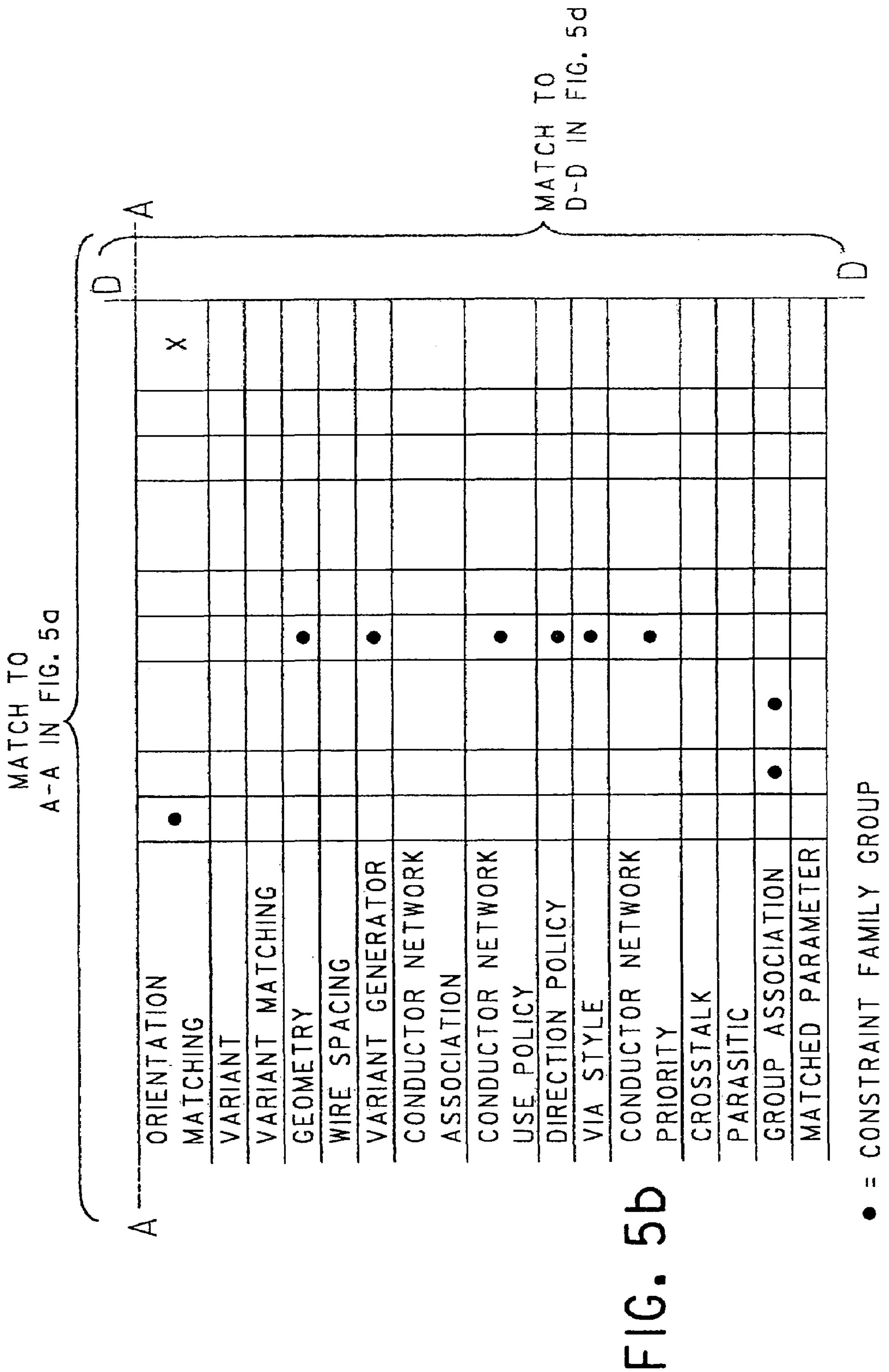
FIG. 5 is a table of Constraint Type vs. Constraint Type including cells for storing groups of interrelated constraints input into one or more of the cells of the table showing in FIG. 4*a*.
Figure 5C:
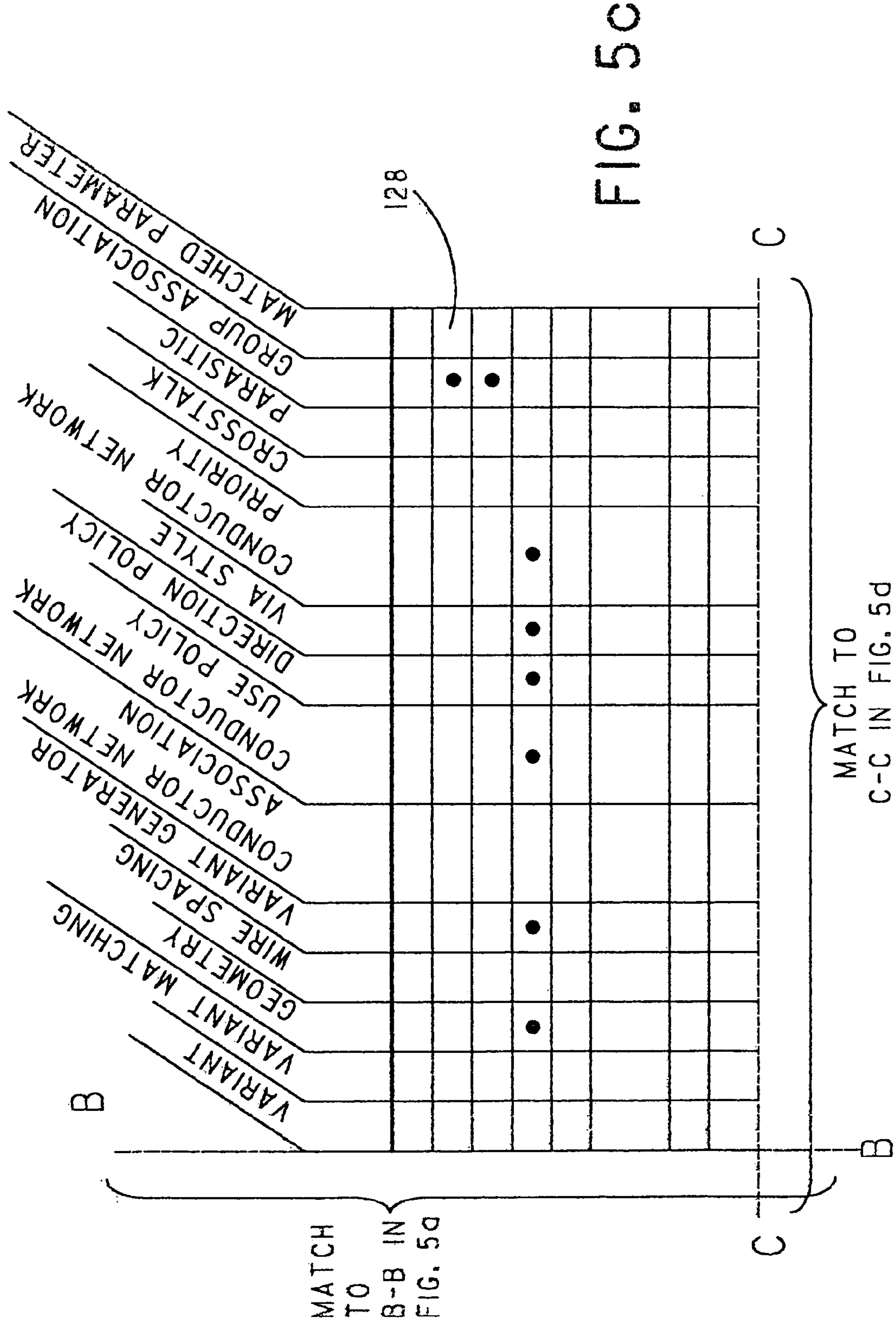
Figure 5D:
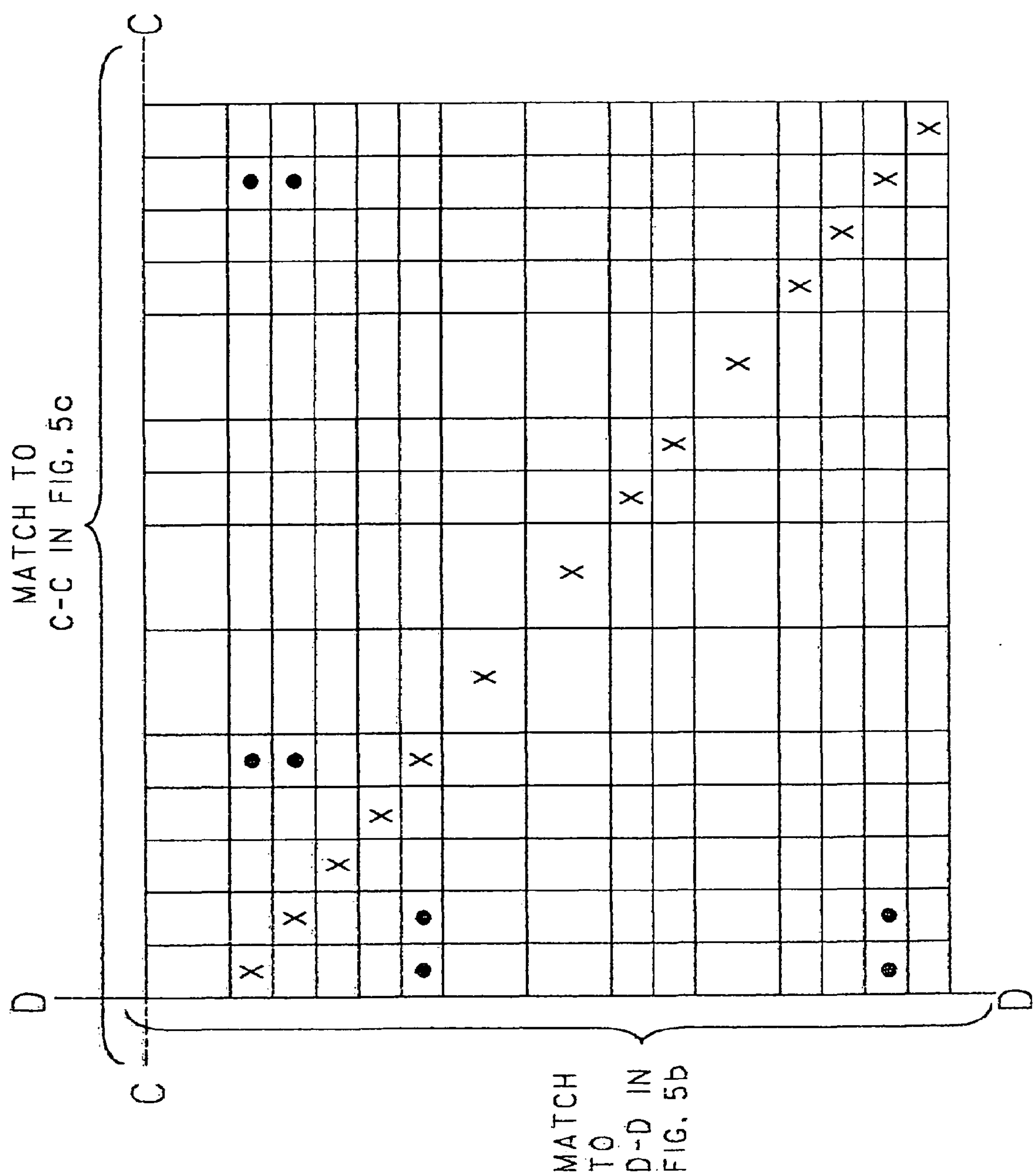

With reference to FIG. 5 and with continuing reference to all previous figures, once it has been determined that each constraint family associated with a cell 122 of table 124 has no conflicts between the constraints thereof, groups of constraint families, or constraint family groups, can be defined from the constraint families associated with the cells 122 of table 124.

Each constraint family group includes constraint families that have been determined to have a high probability of conflict or interaction between the constraints thereof. For example, the constraint families associated with Device—Location cell 122, Pin—Location cell 122, Rail—Location cell 122, Device—Proximity cell 122, Pin—Proximity cell 122 and Rail—Proximity cell 122 of table 124 all relate to positions of circuit objects in the circuit layout and, therefore, have a high probability of conflict between the constraints thereof. Hence, these constraint families are input into a cell 128 of a Cross—Constraint Checking table 126, shown in FIG. 5, at the intersection of the Location column (or row) and the Proximity row (or column). (Note that table 126 is symmetrical about the diagonal cells 128 that include "X"s therein. Hence, it is only necessary to input constraint families from table 124 into appropriate cells 128 of table 126 on one side of these diagonal cells).

More specifically, each constraint family included in cells 122 of the Location row of table 124 and each constraint family included in cells 122 of the Proximity row of table 124 are included in the cell 128 of table 126 at the intersection of the Location column (or row) and the Proximity row (or column), depending on which side of the diagonal of "X" filled cells 128 of table 126 that is being used. The constraint families input into this cell form a constraint family group for the purpose of checking whether one or more conflicts exist between the constraints of each pair of constraint families of this constraint family group. In a similar manner, other constraint family groups can be formed based upon a predetermined probability of a conflict between the constraints of the constraint families thereof. Each constraint family group is comprised of a unique set of constraint families. However, each constraint family can be included in two or more constraint family groups if desired.

The cells 128 of table 126 that includes stars (*) therein are cells that include constraint family groups that have a high probability of containing a conflict between the constraint families thereof. Each empty cell 128 of table 126 has been determined to possess a low probability of a conflict between the constraint families of the corresponding constraint family group. The inclusion or exclusion of stars in cells 128 of table 126, however, is not to be construed as limiting the invention.

In table 126, for each pair of constraint types having a star (*) in the cell 128 at the intersection thereof, the constraint families associated with each circuit object of each constraint type in FIG. 4*a* are included in the constraint family group. For example, cell 128 of table 126 at the intersection of the Location column and the Proximity row includes a star therein. The constraint family group represented by this star includes the constraint families associated with the cells 122 of table 124 at the intersection of the following columns and rows, i.e., Object—Constraint type pairs: Device—Location; Pin—Location; Rail—Location; Device—Proximity; Pin—Proximity; and Rail—Proximity. By way of another example, in FIG. 5, the cell 128 at the intersection of the Symmetry column and Variant Generator row, i.e., the Symmetry—Variant Generator pair, includes a star therein. This star represents the constraint family group comprising the constraint families of the cells 122 of table 124 at the intersection of the following Object—Constraint type pairs: Device—Symmetry; Pin—Symmetry; Device—Variant Generator; and Pin—Variant Generator.

Once each desired constraint family group has been defined, an evaluation is conducted of the constraints of each constraint family group to determine if one or more conflicts exist between the constraints thereof. To facilitate this evaluation, each cell 128 of table 126 which is to receive two or more constraint families as input has associated therewith a software routine that includes one or more predefined criterion for determining if one or more conflicts exists between the constraints of the two or more constraint families.

For each pair of constraint families of each constraint family group, the constraints of one of said pair of constraint families are evaluated against the constraints of the other of said pair of constraint families to determine if one or more conflicts exist between said constraints. For example, if a constraint family group includes constraint families CF1, CF2 and CF3, constraint family pairs (CF1, CF2), (CF1, CF3) and (CF2, CF3) are defined. Thereafter, each constraint of constraint family CF1 is evaluated against each constraint of constraint family CF2; each constraint of constraint family CF1 is evaluated against each constraint of constraint family CF3; and each constraint of constraint family CF2 is evaluated against each constraint of constraint family CF3 to determine if one or more conflicts exist between the constraints of each pair of constraint families.

If one or more conflicts is determined to exist between the constraints of one or more pairs of constraint families of a constraint family group, at least one constraint, desirably at least one constraint contributing to the existence of the one or more conflicts, must be amended to avoid the conflict(s) before generating a circuit layout of the circuit objects subject to the constraints. The amending of one or more constraints of a constraint family group can occur any suitable manner, such as the manner described above for amending one or more constraints of a constraint family that were determined to have a conflict.

After amending one or more constraints of a constraint family group, it is necessary to evaluate each constraint family to determine if a conflict exists between the constraints thereof before determining if one or more conflicts exist between the constraints of one or more pairs of constraint families of the constraint family group. The evaluation of each constraint family to determine if a conflict exists between the constraints thereof can occur in any suitable manner. such as the manner described above for determining if a conflict exists between constraints of the constraint families associated with the cells 122 of table 124 in FIG. 4*a*. Only after it has been determined that each constraint family associated with the cells 122 of table 124 in FIG. 4*a* does not include a conflict between the constraints thereof, can another evaluation of the constraints of each pair of constraint families of each constraint family group associated with the cells 128 of table 126 in FIG. 5 be undertaken to determine if one or more conflicts exist between the constraints thereof.

The process of amending one or more constraints of a constraint family each time a conflict is determined to exist and the subsequent evaluation of each constraint family and each constraint family group to determine if one or more conflicts exist between the constraints thereof continues until it has been determined that no conflicts exist. Thereafter, the circuit objects can be laid out subject to the constraints with a high degree of confidence that the resultant circuit layout will meet most, if not all, of the designer's requirements.

The invention has been described with reference to the preferred embodiment. Obvious modifications and alterations will occur to others upon reading and understanding the preceding detailed description. For example, it is typically not necessary to form constraint family groups in the cells 128 of table 126 that include "X"s therein. However, if desired, constraint family groups can be formed in these cells and each of these family groups can be evaluated for conflicts in the manner described above. Moreover, it is to be appreciated that each table 124 and 126 is realized in the form of a two dimensional matrix in the software program. Accordingly, the foregoing description of the invention in connection with table 124 and 126 is not to be construed in any manner as limiting the invention. It is, therefore, intended that the invention be construed as including all such modifications and alterations insofar as they come within the scope of the appended claims or the equivalents thereof.

The invention claimed is:

1. A computer aided method for determining the existence of one or more conflicts in the placement or configuration of objects defining a circuit in the design of an integrated circuit, the method comprising the steps of:

(a) defining a plurality of constraints each of which imposes at least one limitation on at least one of placement and configuration of at least one object that defines a circuit;

(b) defining a plurality of constraint families each of which is comprised of a subset of the constraints defined in step (a), with each constraint family comprised of constraints of the same type;

(c) determining for each constraint family of a subset of the plurality of constraint families defined in step (b) if a conflict exists between the constraints of said constraint family;

(d) defining pairs of constraint families from the plurality of constraint families defined in step (b);

(e) determining for each pair of constraint families of a subset of the pairs of constraint families defined in step (d) if a conflict exists between at least one constraint of one constraint family of said pair and at least one constraint of the other constraint family of said pair;

(f) amending at least one of the constraints if a conflict is determined to exist in step (e);

(g) repeating steps (c), (e) and (f) if at least one of the constraints was amended in the prior iteration of step (f); and (h) laying out the circuit objects subject to the constraints.

2. The method of claim 1, further including, before step (e), the steps of:

(1) amending at least one of the constraints if a conflict is determined to exist in step (c); and (2) repeating steps (c) and (1) until no conflict is determined to exist in step (c).

3. The method of claim 1, wherein at least one of step (c) and step (f) includes amending at least one of the constraints contributing to the existence of the conflict.

4. The method of claim 1, wherein each constraint family includes at least one constraint associated with at least one object that defines the circuit.

5. The method of claim 4, wherein:

each object is one of a device, a pin, a rail and a conductor network of the circuit; and each constraint is selected from the group consisting of: location constraint, proximity constraint, proximity matching constraint, symmetry constraint, geometry sharing constraint, conductor network crossing constraint, layer association constraint, orientation constraint, orientation matching constraint, variant constraint, variant matching constraint, geometry constraint, wire spacing constraint, variant generator constraint, conductor network association constraint, conductor network use policy constraint, direction policy constraint, via style constraint, conductor network priority constraint, crosstalk constraint, parasitic constraint, group association constraint and a matched parameter constraint.

6. The method of claim 1, wherein:

each constraint family in step (c) has associated therewith at least one criterion for determining the existence of a conflict between the constraints of said constraint family; and each pair of constraint families in step (e) has associated therewith at least one criterion for determining the existence of a conflict between the constraints of said pair of constraint families.

7. The method of claim 1, wherein:

step (a) includes the steps of:

inputting at least one circuit object into a template that includes at least one constraint for placement or configuration of the circuit object in the circuit; and determining if the circuit object can be implemented in accordance with the constraint; and step (b) includes the step of:

if the circuit object can be implemented in accordance with the constraint, associating the constraint with one of the constraint families.

8. The method of claim 7, wherein:

step (a) further includes:

inputting into the template a number of circuit objects, with the number of circuit objects either being the same or different than the number of constraints of the template; and determining if the number of circuit objects can be implemented in accordance with the constraints; and step (b) further includes:

if the number of circuit objects can be implemented in accordance with the constraints, associating the constraints with at least one of the constraint families.

9. The method of claim 8, wherein step (b) further includes associating one subset of the constraints of the template with one constraint family and another subset of the constraints of the template with another constraint family.

10. The method of claim 7, wherein the template is associated with one of placement and routing of the circuit object in the circuit.

11. A computer aided method for determining the existence of one or more conflicts in the placement or configuration of objects defining a circuit in the design of an integrated circuit, the method comprising the steps of:

(a) defining a plurality of constraints each of which imposes at least one limitation on at least one of placement and configuration of at least one object that define a circuit;

(b) defining a plurality of constraint families each of which is comprised of a subset of the constraints that can interrelate;

(c) determining for each constraint family of a subset of the plurality of constraint families defined in step (b) if a conflict exists between the constraints of said constraint family;

(d) if a conflict is determined to exist in step (c), amending at least one of the constraints of said constraint family;

(e) repeating steps (c) and (d) if at least one constraint was amended in the prior iteration of step (d);

(f) defining pairs of constraint families from the plurality of constraint families defined in step (b);

(g) determining for each pair of constraint families of a subset of the pairs of constraint families defined in step (f) if a conflict exists between the constraints of said pair of constraint families;

(h) if a conflict is determined to exist in step (g), amending at least one of the constraints of said pair of constraint families;

(i) repeating steps (g) and (h) if at least one constraint was amended in the prior iteration of step (h); and (j) laying out the circuit objects subject to the constraints.

12. The method of claim 11, wherein:

step (d) includes amending at least one of the constraints contributing to the existence of the conflict in step (c); and step (h) includes amending at least one of the constraints contributing to the existence of the conflict in step (g).

13. The method of claim 11, wherein:

each constraint family in step (c) has associated therewith at least one criterion for determining the existence of a conflict between the constraints of said constraint family; and each pair of constraint families in step (g) has associated therewith at least one criterion for determining the existence of a conflict between the constraints of said pair of constraint families.

14. The method of claim 11, wherein:

step (a) includes the steps of:

inputting at least one circuit object into a template that includes at least one constraint for placement or configuration of the circuit object in the circuit; and determining if the circuit object can be implemented in accordance with the constraint; and step (b) includes the step of:

if the circuit object can be implemented in accordance with the constraint, associating the constraint with one of the constraint families.

15. The method of claim 14, wherein:

step (a) further includes:

inputting into the template a number of circuit objects, with the number of circuit objects either being the same or different than the number of constraints of the template; and determining if the number of circuit objects can be implemented in accordance with the constraints; and step (b) further includes:

if the number of circuit objects can be implemented in accordance with the constraints, associating the constraints with at least one of the constraint families.

16. The method of claim 15, wherein step (b) further includes associating one subset of the constraints of the template with a first constraint family and associating another subset of the constraints of the template with a second constraint family.

17. The method of claim 14, wherein the template is associated with one of placement and routing of the circuit object in the circuit.

18. A computer aided method for determining the existence of one or more conflicts in the placement or configuration of objects defining a circuit in the design thereof, the method comprising the steps of:

(a) selecting objects that define a circuit;

(b) associating constraints with a subset of the selected objects, with each constraint imposing at least one restriction on at least one of a placement, routing and/or configuration of at least one of the selected objects;

(c) defining a first matrix of objects vs. constraint types, wherein each cell of the first matrix is related to a unique object—constraint type pair and each constraint in step (b) corresponds to one of the constraint types of the first matrix;

(d) associating each constraint in step (b) with one of the cells of the first matrix that has said constraint as the constraint type of its related object—constraint type pair, whereupon the constraint(s) associated with each cell define an associated constraint family;

(e) determining for each constraint family that includes a plurality of constraints if at least one conflict exists between the constraints of said constraint family;

(f) defining a second matrix of constraint types vs. constraint types, wherein the constraint types of the second matrix are the same as the constraint types of the first matrix and each cell of the second matrix is related to a unique constraint—constraint pair;

(g) associating with each cell of a subset of the cells of the second matrix the constraint families associated with the cells of the first matrix that have as the constraint types of their related constraint—object pairs one of the constraint types of the constraint—constraint pair associated with the cell of the second matrix;

(h) determining for each pair of constraint families associated with a cell of the second matrix if a conflict exists between at least one constraint of one constraint family of said pair and at least one constraint of the other constraint family of said pair;

(i) amending at least one constraint if a conflict is determined to exist in step (h);

(j) repeating steps (h) and (i) until no conflict is determined to exist in step (h); and (k) laying out the objects defining the circuit subject to the constraints.

19. The method of claim 18, wherein step (i) includes amending at least one constraint contributing to the existence of the conflict in step (h).

20. The method of claim 18, further including, before step (h), the steps of:

(1) amending at least one constraint if a conflict is determined to exist in step (e); and (2) repeating steps (e) and (1) until no conflict is determined to exist in step (e).

21. The method of claim 20, wherein step (1) includes amending at least one constraint contributing to the existence of the conflict in step (e).

22. The method of claim 18, further including the steps of:

inputting at least one selected object into a template that includes at least one constraint on the placement, routing or configuration of the object in the circuit; and associating the constraint with one of the constraint families.

23. The method of claim 18, wherein:

inputting a plurality of objects into a template that includes for a subset of said objects constraints on the placement, routing or configuration thereof in the circuit; and associating a subset of the template constraints with one of the constraint families.

24. The method of claim 23, further including associating one subset of template constraints with one constraint family and another subset of template constraints with another constraint family.

* * * * *